United States Patent
Hojo et al.

(10) Patent No.: US 6,800,919 B2
(45) Date of Patent: Oct. 5, 2004

(54) SEMICONDUCTOR DEVICE HAVING A REDUNDANCY FUNCTION

(75) Inventors: Takehiko Hojo, Yokohama (JP); Kaoru Tokushige, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 86 days.

(21) Appl. No.: 10/391,260

(22) Filed: Mar. 19, 2003

(65) Prior Publication Data

US 2004/0119139 A1 Jun. 24, 2004

(30) Foreign Application Priority Data

Dec. 24, 2002 (JP) ........................................ 2002-372382

(51) Int. Cl.$^7$ ............................................... H01L 29/00
(52) U.S. Cl. ...................................... 257/529; 257/209
(58) Field of Search ......................... 257/527.103, 529, 257/208, 209; 365/200, 230.83, 230.06, 189.09, 496

(56) References Cited

U.S. PATENT DOCUMENTS

| | | | | |
|---|---|---|---|---|
| 5,394,536 A | * | 2/1995 | Coghlan et al. | 714/14 |
| 5,784,705 A | * | 7/1998 | Leung | 711/169 |
| 5,787,043 A | * | 7/1998 | Akioka et al. | 365/200 |
| 2002/0167849 A1 | * | 11/2002 | Ohbayashi et al. | 365/189.09 |

OTHER PUBLICATIONS

Michael R. Ouellette, et al., "Shared Fuse Macro for Multiple Embedded Memory Devices With Redundancy", Proceedings of the IEEE Custom Integrated Circuits Conference, 2001, 4 pages.

* cited by examiner

Primary Examiner—David Nelms
Assistant Examiner—Thinh T Nguyen
(74) Attorney, Agent, or Firm—Oblon, Spivak, McClelland, Maier & Neustadt, P.C.

(57) ABSTRACT

A semiconductor device includes first to third functional areas parted each other by a boundary region on a semiconductor substrate. A memory block is formed in the first functional area and includes memory cells and a redundancy memory cell substituted for one memory cell. A functional circuit block is formed in the second functional area and connected with the memory block via an interconnection line. A program interconnection block is formed in the third functional area so that it does not overlap with the interconnection line and includes a program interconnection section which forms a program forming a signal path so that a defective memory cell is substituted by the redundancy memory cell. A data transfer section extends over from the program interconnection block to the memory block and transfers program information relevant to the program of the program interconnection section to the memory block.

23 Claims, 4 Drawing Sheets

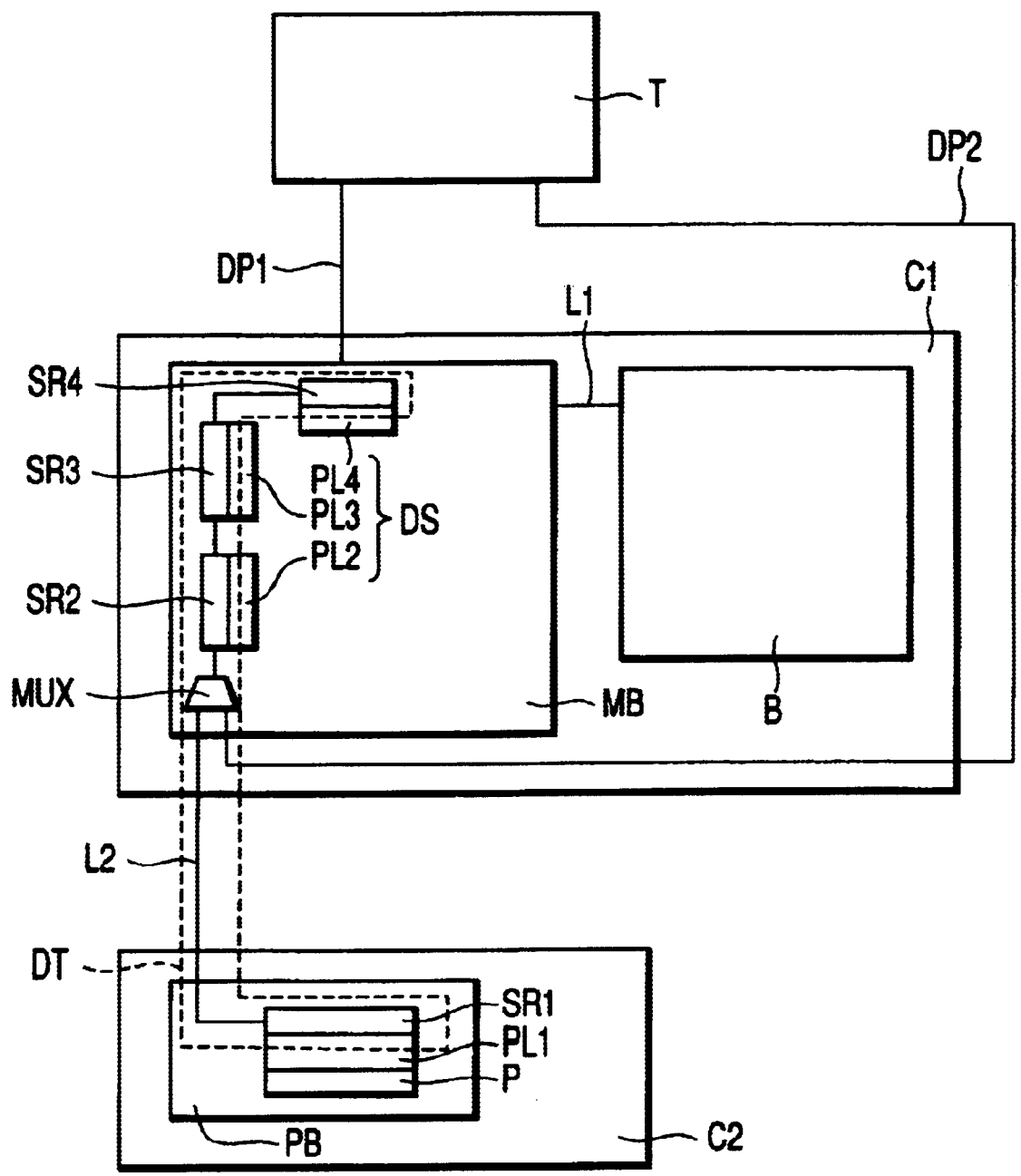
F I G. 5

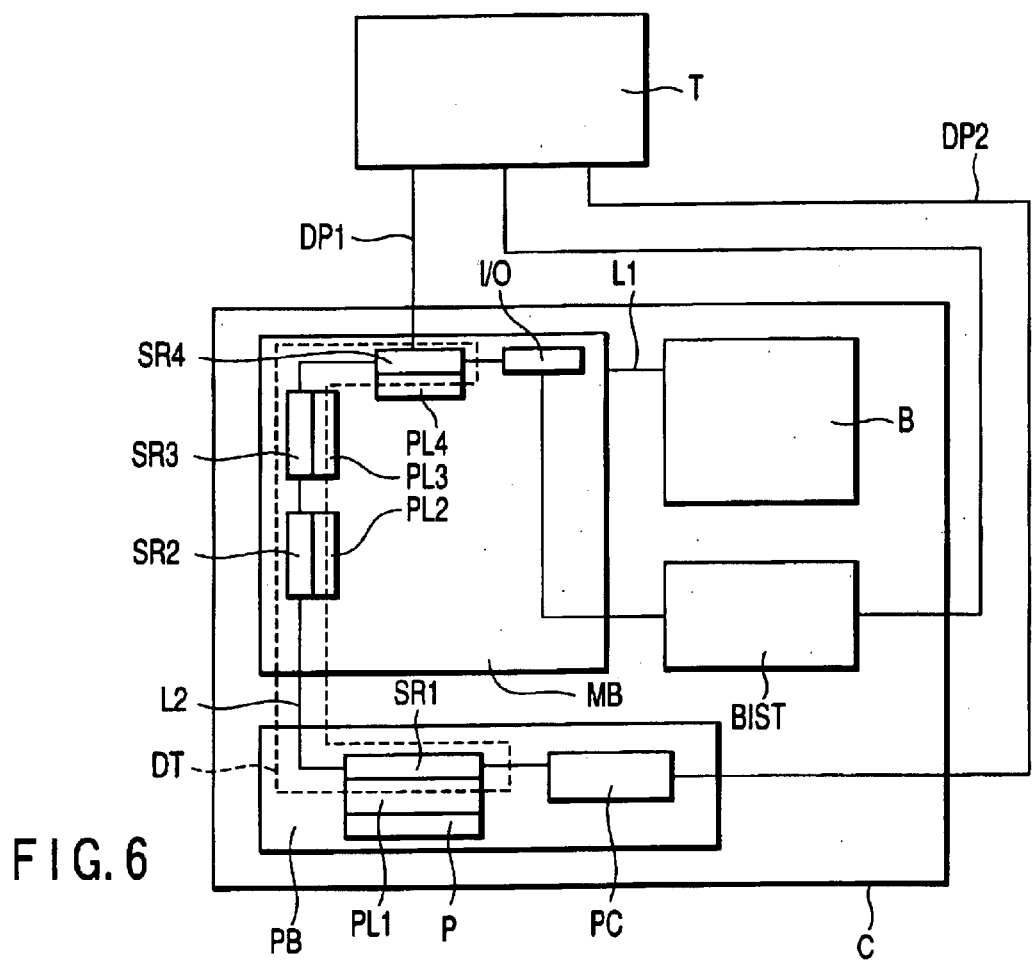
F I G. 6

SEMICONDUCTOR DEVICE HAVING A REDUNDANCY FUNCTION

CROSS-REFERENCE TO RELATED APPLICATIONS

This application is based upon and claims the benefit of priority from the prior Japanese Patent Application No. 2002-372382, filed Dec. 24, 2002, the entire contents of which are incorporated herein by reference.

BACKGROUND OF THE INVENTION

1. Field of the Invention

The present invention relates to a semiconductor device, and more particularly, to a semiconductor device having a redundancy function.

2. Description of the Related Art

There has been known a so-called system LSI (Large-Scale Integrated Circuit), which integrates memory and logic circuits into one semiconductor chip so that one system can be formed. In the system LSI, a plurality of functional blocks (core or macro) such as a memory circuit and a logic circuit is provided on a semiconductor chip.

In a memory device or block, there has been known a defect recovery method using a redundancy circuit. More specifically, a redundancy memory cell is provided in addition to a memory cell array, and is used in place of a memory cell, which becomes defective due to a defect generated in the manufacturing process.

FIG. 7 is a view schematically showing a conventional semiconductor device having a memory macro including a redundancy function. As seen from FIG. 7, a redundancy cell or redundancy memory line RC is provided in a memory block MB included in a semiconductor chip C.

When making the operation test of the semiconductor device, an internal circuit is programmed using a program interconnection section P comprising a plurality of fuses or the like. The above internal circuit makes the following operation. That is, when the semiconductor device is actually used, even if the address of a defective memory cell or line including a memory cell is input, selection is switched into the redundancy memory cell RC.

A fuse has a metal interconnection line such as copper. Laser cuts the metal interconnection line, via an opening formed in the fuse, and thereby, an internal circuit is programmed. Cut or non-cut information of the fuse is stored in a latch PL. When a redundancy function operates, reference to the above information is made, and thereby, access is switched from the defective memory cell to the redundancy memory cell RC.

The fuse of the program interconnection P and the latch PL are fixed in the memory block MB, and often formed along the surroundings of the memory block MB as shown in FIG. 7. For this reason, an interconnection line L1 connecting the memory block MB and a functional circuit block B such as a logic circuit passes above the fuse. However, as described above, the metal interconnection line included in the fuse is exposed via the opening. As a result, the above interconnection line L1 passes above the fuse, and thereby, this is a factor causing a short circuit.

BRIEF SUMMARY OF THE INVENTION

According to a first aspect of the present invention, there is provided a semiconductor device comprising: a semiconductor substrate; a first, second and third functional areas parted each other by a boundary region on the semiconductor substrate; a memory block formed in the first functional area, and including a plurality of memory cells recording information and a redundancy memory cell, the memory cell being substituted for at least one memory cell of the plurality of memory cells and recording information in place of the memory cell; a functional circuit block formed in the second functional area, and connected with the memory block via an interconnection line; a program interconnection block formed in the third functional area, the program interconnection block being provided on the substrate so that it does not overlap with the interconnection line on a plane of the substrate and including a program interconnection section which forms a program forming a signal path so that a defective memory cell can be substituted by the redundancy memory cell; and a data transfer section extending over from the program interconnection block to the memory block, and transferring program information relevant to the program of the program interconnection section to the memory block.

According to a second aspect of the present invention, there is provided a semiconductor device comprising: a semiconductor substrate; first to n+2-th (n: integer of 2 or more) functional areas parted each other by a boundary region on the semiconductor substrate; first to n-th memory blocks formed in the first to n-th functional areas, respectively, and each of the first to n-th memory blocks including a plurality of memory cells recording information, and a redundancy memory cell substituted for at least one memory cell and recording information in place of the memory cell; a functional circuit block formed in the n+1-th functional area, and connected with the first to n-th memory blocks via an interconnection line; a program interconnection block formed in the n+2-th functional area so that it does not overlap with the interconnection line on a plane of the substrate and including a program interconnection section which forms a program forming a signal path so that a defective memory cell can be substituted by the redundancy memory cell; a first data transfer section extending over from the program interconnection block to the first memory block, and transferring program information relevant to the program of the program interconnection section to the first memory block; and second to n-th data transfer sections respectively extending over from i-th (i: natural number) memory block to i+1-th memory block, and respectively transferring program information of the i-th memory block to the i+1-th memory block.

According to a third aspect of the present invention, there is provided a semiconductor device comprising: a memory block provided on a first semiconductor substrate, and including a plurality of memory cells recording information and a redundancy memory cell, the memory cell being substituted for at least one memory cell of the plurality memory cells and recording information in place of the memory cell; a program interconnection block provided on a second semiconductor substrate, and including a program interconnection section which forms a program forming a signal path so that a defective memory cell can be substituted by the redundancy memory cell; and a data transfer section extending over from the program interconnection block to the memory block, and transferring program information relevant to the program of the program interconnection section to the memory block.

BRIEF DESCRIPTION OF THE SEVERAL VIEWS OF THE DRAWING

FIG. 5 is a block diagram schematically showing a semiconductor device according to a fifth embodiment of the present invention;

FIG. 6 is a block diagram schematically showing a semiconductor device according to a sixth embodiment of the present invention.

DETAILED DESCRIPTION OF THE INVENTION

Figure 1:
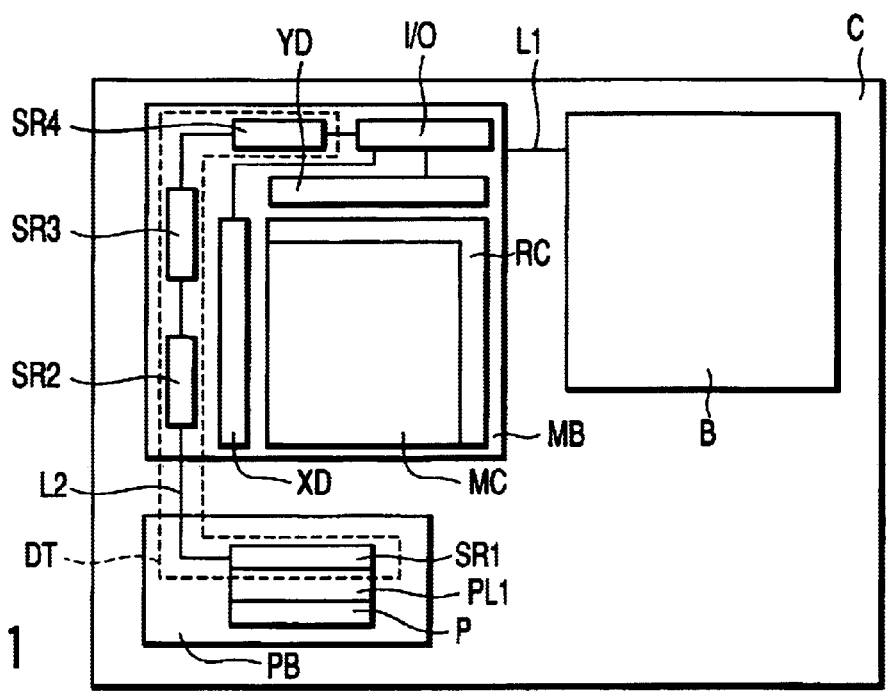
FIG. 1 is a block diagram schematically showing a semiconductor device according to a first embodiment of the present invention.

Embodiments of the present invention will be described below with reference to the accompanying drawings. In the following description, the same reference numerals are given to constituent elements having substantially the same function and configuration, and the description is repeated, if necessary.

(First embodiment)

FIG. 1 is a block diagram schematically showing a semiconductor device according to a first embodiment of the present invention. The semiconductor device has a memory block MB, a program interconnection block and a functional circuit block B such as a logic circuit. The above functional blocks individually have a specific function, and are arranged on a semiconductor chip (semiconductor substrate) C so that a region (boundary region) where no functional block is formed can surround each of them. In other words, the boundary region parts functional areas each other and the functional blocks are formed in each of the functional areas on the semiconductor chip C. The functional circuit block B is connected with the memory block MB by an interconnection line L1 provided on the semiconductor chip C.

The memory block MB is provided with a memory cell array MC. The memory cell array MC comprises a plurality of memory cells (not shown). Further, the memory block MB is provided with a redundancy memory cell or redundancy memory cell line (hereinafter, referred simply to as a redundancy memory cell) RC. The redundancy memory cell RC is substituted for memory cell or memory cell line, which is regarded as being defective from the result of the operation test. Typically, the redundancy memory cell is substituted for the defective memory cell at the unit of a bit line or word line.

The memory block MB has a function of writing information to a memory cell having a predetermined address and reading it from the memory cell, based on external control signals. Typically, the memory block MB includes an X decoder XD, a Y decoder YD and an input/output control circuit I/O. For example, a DRAM (dynamic Random Access Memory) and an SRAM (Static RAM) are used as the memory block MB.

The program interconnection block PB is arranged on the semiconductor chip C so that it does not overlap with the interconnection line L1 on the plane of the semiconductor chip C. The program interconnection block PB and the memory block MB are connected via a data transfer section DT. The data transfer section DT extends over from the program interconnection block PB to the memory block MB, and has a function of transferring information stored in the program interconnection block PB to the memory block MB. The data transfer section DT comprises, for example, a plurality of shift registers SR1 to SR4 connected in series and an interconnection line L2.

The program interconnection block PB is provided with a program interconnection section P. The program interconnection section P forms programs of the internal circuit forming a signal path so that a defective memory cell can be substituted by the redundancy memory cell RC. More specifically, if a memory cell having the input address is defective, the program interconnection section P generates (forms) programs so that access can be made to the redundancy memory cell RC substituted for the above memory cell. Various methods have been publicly known as the method of forming the program. Typically, the program interconnection section P may be composed of a plurality of fuses or a non-volatile memory such as flash memory.

The program interconnection block PB is provided with, for example, a latch PL1. In a redundancy function operation, the latch PL1 captures program information of the program interconnection section P, and holds it. If a fuse is used as the program interconnection section P, the program information corresponds to information presenting cutting or non-cutting of the fuse. In this case, the latch PL1 is provided with respect to each fuse, and holds the information of the corresponding fuse.

The program information held in the latch PL1 is successively stored in the shift register SR1 provided in the program interconnection block PB. The program information held in the shift register SR1 is successively transferred in the data transfer section DT in accordance with a clock pulse supplied to individual shift registers SR1 to SR4 of the data transfer section DT. In the above manner, the program information of the program interconnection block PB is transferred to the memory block MB. In the redundancy function operation, reference is made to the program information stored in the shift register SR4 of the memory block MB, and thereby, access is switched from the defective memory cell to the redundancy memory cell RC.

According to the first embodiment, the program interconnection section P used for the redundancy function operation is provided in the program interconnection block PB arranged independently from the memory block MB. The program interconnection block PB is arranged so that it does not overlap with the interconnection line L1 connecting the memory block MB and other functional circuit block B on the plane of the semiconductor chip C. The program information of the program interconnection block PB is transferred to the memory block MB by the memory data transfer section DT. The configuration described above is provided, and thereby, it is possible to prevent the interconnection line L1 from passing over the program interconnection section P. Therefore, even when fuse is used as the program interconnection section P, it is possible to eliminate a possibility that the interconnection line L1 and the fuse short-circuit.

The program interconnection block PB is independently arranged; therefore, it is possible to improve the degree of freedom when arranging functional blocks on the semiconductor chip.

(Second embodiment)

Figure 2:
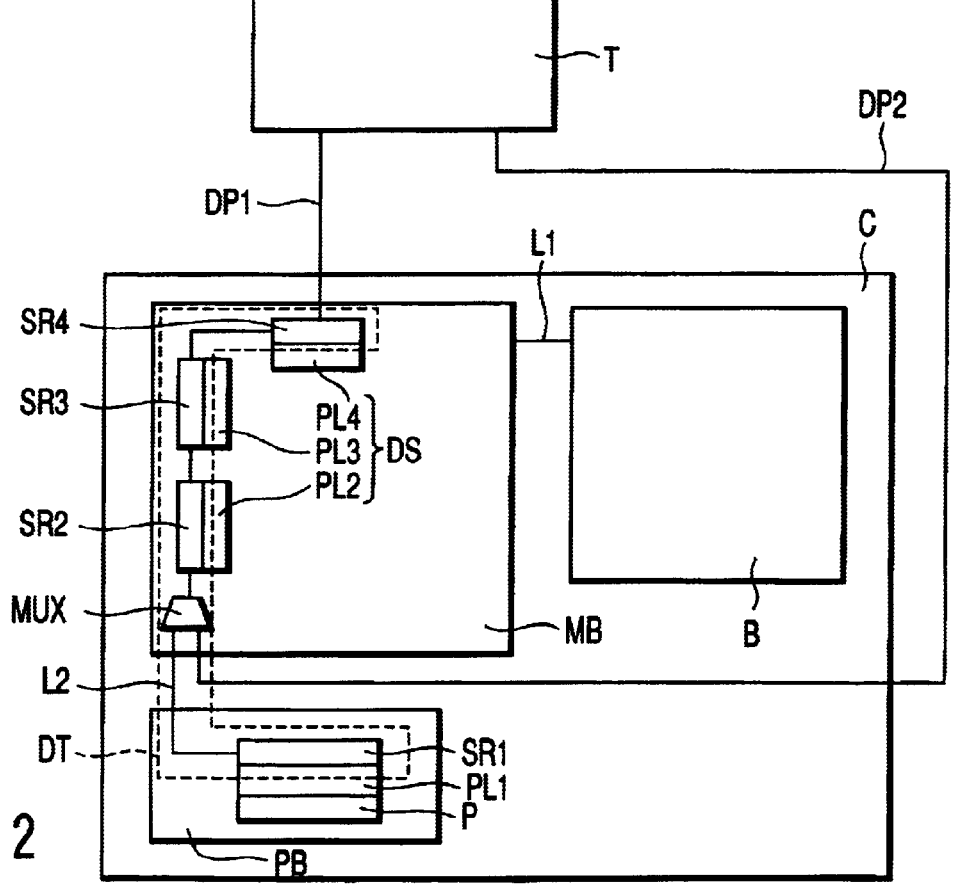
FIG. 2 is a block diagram schematically showing a semiconductor device according to a second embodiment of the present invention.

FIG. 2 is a block diagram schematically showing a semiconductor device according to a second embodiment of the present invention. In the drawings showing embodiments after the second embodiment, elements included in the memory block MB, that is, the memory cell array MC, redundancy memory cell RC, X decoder XD, a Y decoder YD and input/output control circuit I/O are omitted for the simplicity of an explanation.

The semiconductor device of the second embodiment is provided with a data holding section DS connected with the data transfer section DT included in the memory block MB. The data holding section DS has a function of holding data stored in the data transfer section DT. The data holding section DS is typically composed of latches PL2 to PL4. The latches PL2 to PL4 are provided corresponding to shift registers SR2 to SR4, and hold data stored in the corresponding shift registers SR2 to SR4.

The data transfer section DT has a selection control section MUX provided in the memory block MB. Typically, a multiplexer is used as the selection control section MUX. An output signal from the shift register SR1 is supplied to one input of the selection control section. An output signal from a tester T provided outside the semiconductor chip is supplied to the other input of the selection control section via a data path DP2. An output signal of the selection control section MUX is supplied to the shift register SR2.

The final-stage shift register SR4 included in the data transfer section DT is connected with the tester T provided outside the semiconductor device via the data path DP1. Program information of the shift register SR4 is supplied to the tester T via the data path DP1.

The following is a description of the operation of the semiconductor device having the above configuration. As already described in the first embodiment, in the redundancy function operation, the program information of the program interconnection section P is successively transferred in the data transfer section, and stored in the shift register SR4.

In the operation test of the semiconductor device, it is desired to determine whether or not the data stored in the shift register SR4 accurately reflects the program information of the program interconnection section P. In this case, a clock pulse is supplied to individual shift registers SR1 to SR4, and the program information is successively shifted. By doing so, the program information is supplied to the tester T. Thereafter, the tester T confirms the program information. As described above, the program information is supplied to the tester T; as a result, previously input program information is lost. For this reason, before the operation test is carried out, the data holding section DS holds the program information.

In the program interconnection section P, it is desired to carry out a test whether or not the redundancy function is accurately operated without actually forming programs. In this case, the selection control section MUX switches the input to the shift register SR2 to a signal from the tester T, and thereby, pseudo program information of the program interconnection section P is input to the shift register SR2 from the tester T. In this manner, the tester T determines whether or not the redundancy function is accurately operated.

According to the second embodiment, the semiconductor device has the data holding section DS connected with the data transfer section DT of the memory block MB. Before the operation test of the semiconductor device is carried out, the data holding section DS holds the program information of the program interconnection section P. Thus, even if the final-stage shift register SR4 of the data transfer section DT reads the program information to the tester T, it is possible to prevent the program information of the program interconnection section P from being lost.

The semiconductor device further has the selection control section MUX provided in the memory block MB. The output signals from the shift register SR1 of the program interconnection block PB and from the tester T are input to the selection control section MUX. Pseudo program information of the program interconnection section P is supplied from the tester T. By doing so, it is possible to confirm the redundancy function operation without actually forming programs in the program interconnection section P.

(Third embodiment)

Figure 3:
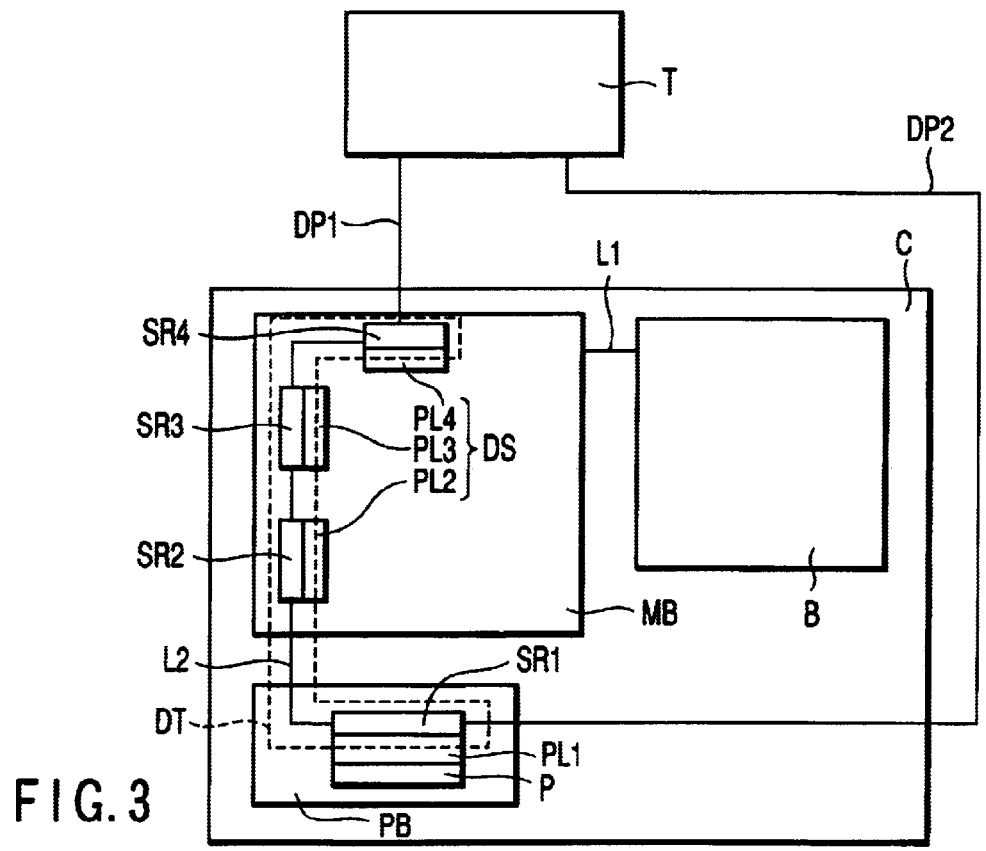
FIG. 3 is a block diagram schematically showing a semiconductor device according to a third embodiment of the present invention.

FIG. 3 is a block diagram schematically showing a semiconductor device according to a third embodiment of the present invention. In the above second embodiment, the memory block MB is provided with the selection control section MUX, and the output signals from the shift register SR1 of the program interconnection block PB and from the tester T are input to the selection control section MUX. Conversely, in the third embodiment, the signal from the tester T is directly supplied to the shift register SR1 of the program interconnection block PB, in addition to the signal from the latch PL1.

According to the third embodiment, the same effect as the second embodiment can be obtained.

(Fourth embodiment)

Figure 4:
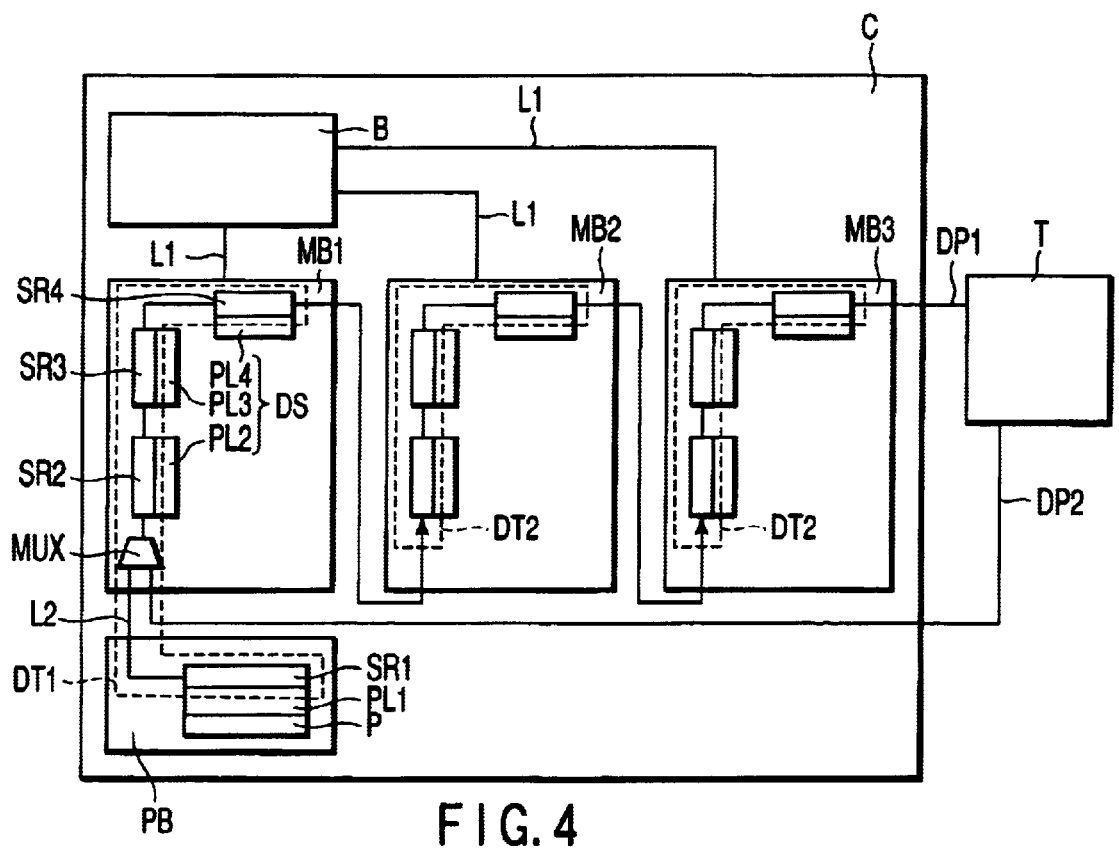
FIG. 4 is a block diagram schematically showing a semiconductor device according to a fourth embodiment of the present invention.
Figure 7:
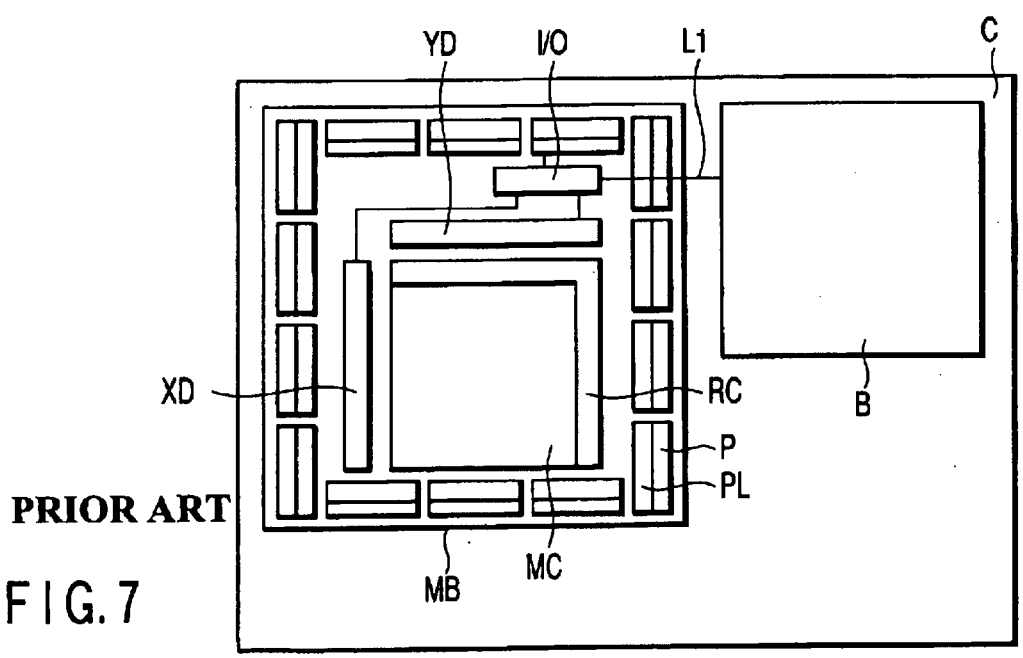
FIG. 7 is a block diagram schematically showing a conventional semiconductor device.

FIG. 4 is a block diagram schematically showing a semiconductor device according to a fourth embodiment of the present invention. In the fourth embodiment, a plurality of memory blocks is arranged on the semiconductor chip C. The following is an exemplary description of the case where three blocks are provided.

As shown in FIG. 4, memory blocks MB1 to MB3 are arranged on the semiconductor chip C. The memory blocks MB1 has the same configuration as the memory block MB described in the second embodiment. The memory block MB2 and MB3 have the same configuration as the memory block described in the first embodiment. The memory blocks MB1 to MB3 are connected with the functional circuit block B via the interconnection line L1.

The program interconnection block PB and the memory blocks MB1 to MB3 are connected in series as described in the following. The program information of the program interconnection block PB is transferred to the memory block MB1 by the same data transfer section DT1 as the second embodiment. In other words, the output signals from the shift register SR1 of the program interconnection block PB and from the tester T are supplied to the selection control section MUX of the memory block MB1. The output signal of the selection control section MUX is supplied to the shift register SR2 of the data transfer section DT1.

Information of each shift register SR4 of the memory blocks MB1 and MB2 is transferred to each of the memory blocks MB2 and MB3 by the same data transfer section DT2 as the first embodiment. The output signal of the final-stage shift register SR4 of the memory block MB3 is supplied to the tester T.

The following is a description of the effect of the semiconductor device having the configuration described above. For example, if an image signal having RGB elements is processed using the semiconductor device according to the fourth embodiment, R, G and B elements may be allocated to the memory blocks MB1 to MB3, respectively. By doing so, it is possible to effectively make access between functional circuit blocks such as a logic circuit and memory cells.

The memory blocks MB1 to MB3 may be used for various purposes. In this case, for example, one memory block is used as an image data buffer, and another memory block is used for data exchange (work RAM (Random Access Memory)) with a CPU (Central Processing Unit). As described above, a different function is allocated to each memory block, and thereby, it is possible to improve the operation efficiency of the semiconductor device (system LSI).

According to the fourth embodiment, the semiconductor device has a plurality of memory blocks MB1 to MB3 connected in series, in addition to the configuration of the first and second embodiments. The above configuration is provided, and thereby, the memory blocks MB1 to MB3 have different functions; therefore, the operation efficiency of the semiconductor device can be improved in addition to the same effect as the first and second embodiments.

(Fifth embodiment)

FIG. 5 is a block diagram schematically showing a semiconductor device according to a fifth embodiment of the present invention. In the above first to fourth embodiments, the memory block MB and the program interconnection block PB are arranged on one semiconductor chip. Conversely, in the fifth embodiment, the memory block MB and the program interconnection block PB are individually arranged on an independent semiconductor chip.

As seen from FIG. 5, the semiconductor device has semiconductor chips C1 and C2. The memory block MB having the same configuration as the second embodiment and the functional circuit block are arranged on the semiconductor chip C1. The above blocks are connected via the interconnection line L1. The memory block MB is connected with the tester T via data paths DP1 and DP2.

On the other hand, the program interconnection block PB having the same configuration as the first embodiment is arranged on the semiconductor chip C2. The program information of the program interconnection block PB is transferred to the memory block MB by the data transfer section DT having the same configuration as the second embodiment.

According to the fifth embodiment, the program interconnection block PB and the memory block MB are individually formed on the semiconductor chips C1 and C2 independent from each other. Thus, the same effect as the first and second embodiment is obtained, and in addition, the following effect can be obtained.

With the development of semiconductor manufacturing techniques, micro-fabrication of semiconductor devices has been advanced inclusive of functional blocks. If a fuse is used as the program interconnection section, other sections excluding the fuse of the memory block are micro-fabricated; however, it is difficult to micro-fabricate the fuse in accordance with the above micro-fabrication of the memory block. For this reason, if the fuse of the memory block and other sections are provided together on one semiconductor chip, it is difficult to entirely micro-fabricate the memory block. Considering the above circumstances, the memory block MB comprising the part excluding the fuse and the program interconnection block PB are provided on another semiconductor chip. By doing so, it is possible to micro-fabricate the memory block MB without being limited by fuse manufacturing techniques. General-purpose products are used as the memory block MB, and thereby, it is possible to reduce the manufacturing cost of the semiconductor device.

It is easy to apply a non-volatile memory as the program interconnection section P. More specifically, the manufacturing process differs in the principal parts of the memory block such as the memory cell array and its control circuit and the non-volatile memory such as a flash memory. The fifth embodiment is employed, and thereby, it is possible to fabricate the semiconductor chips C1 and C2 without being limited by the difference in the manufacturing process between the above principal parts and the non-volatile memory. Therefore, employing the fifth embodiment is effective in manufacturing cost and micro-fabrication.

(Sixth embodiment)

FIG. 6 is a block diagram schematically showing a semiconductor device according to a sixth embodiment of the present invention. As shown in FIG. 6, an on-chip self-test functional (Built In Self-Test: BIST) circuit BIST is provided on the semiconductor chip C. The BIST circuit BIST is connected with the input/output control circuit I/O of the memory block MB and the tester T. The BIST circuit previously stores programs required for the operation test of the memory block MB, and automatically carries out the operation test of the memory block MB according to the stored programs. The BIST circuit BIST outputs the operation test result to the tester T.

In a program interconnection block PB, the program interconnection section P comprises a non-volatile memory such as a flash memory, or program element electrically programmable, such as an e-fuse. The e-fuse is a device (element), which enables writing of the same cutting information as a normal fuse by an electrical signal.

The program interconnection block PB includes a program interconnection control section (control circuit section) PC, in addition to the configuration described in the first embodiment. The program interconnection control section PC is connected with the tester T, and forms programs in the program interconnection section P in accordance with the signal from the tester T.

According to the sixth embodiment, the same effect as the first embodiment can be obtained. In the sixth embodiment, the self-test functional circuit is formed on the semiconductor chip C, and the program interconnection section P comprises a program element electrically programmable. Therefore, in accordance with the signal from the tester T, the program interconnection control section PC electrically forms programs in the program interconnection section P. As a result, it is possible to effectively carry out the operation test of the semiconductor device and to substitute a redundancy cell for a defective memory cell.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate;
   a first, second and third functional areas parted each other by a boundary region on the semiconductor substrate;
   a memory block formed in the first functional area, and including a plurality of memory cells recording information and a redundancy memory cell, the redundancy memory cell being substituted for at least one memory cell of the plurality of memory cells and recording information in place of the memory cell, the memory block having a function of writing information to and reading information from the memory cell, no fuse being provided in the memory block;
   a functional circuit block formed in the second functional area, and connected with the memory block via an interconnection line;
   a program interconnection block formed in the third functional area, the program interconnection block being provided on the substrate so that it does not overlap with the interconnection line on a plane of the substrate and including a program interconnection section which forms a program forming a signal path so that a defective memory cell can be substituted by the redundancy memory cell; and a data transfer section extending over from the program interconnection block to the memory block, and transferring program information relevant to the program of the program interconnection section to the memory block.

2. The device according to claim 1, wherein the memory block, the functional circuit block and the program interconnection block are macros of a system LSI.

3. The device according to claim 1, wherein the program interconnection section has an element selected from a group consisting of a fuse and a non-volatile memory.

4. The device according to claim 1, wherein the data transfer section has a plurality of shift registers connected in series.

5. The device according to claim 4, further comprising:
a data path connected with the final-stage of the plurality of shift registers, and outputting the program information to the outside of the memory block.

6. The device according to claim 1, further comprising:
a data holding section connected with the data transfer section, and holding the program information of the data transfer section.

7. The device according to claim 1, wherein the data transfer section further comprises a selection control section, which is connected in series between the plurality of shift registers, and selectively outputs the program information supplied from the program interconnection block and external program information supplied from the outside.

8. The device according to claim 1, wherein the program interconnection section has a program element electrically programmable, and the semiconductor device further comprises a control circuit, which is provided on the substrate and forms the program in the program element in accordance with a control signal.

9. The device according to claim 8, further comprising a test circuit provided on the substrate, the test circuit having a function of carrying out an operation test of the memory cell of the memory block, the control circuit further having a function of forming the program in the program interconnection section in accordance with the operation test result.

10. A semiconductor device comprising:
a semiconductor substrate;
first to n+2-th (n: integer of 2 or more) functional areas parted each other by a boundary region on the semiconductor substrate;
first to n-th memory blocks formed in the first to n-th functional areas, respectively, and each of the first to n-th memory blocks including a plurality of memory cells recording information, and a redundancy memory cell substituted for at least one memory cell and recording information in place of the at least one memory cell, the first to n-th memory blocks each having a function of writing information to and reading information from the memory cell, no fuse being provided in the first to n-th memory blocks;
a functional circuit block formed in the n+1-th functional area, and connected with the first to n-th memory blocks via an interconnection line;
a program interconnection block formed in the n+2-th functional area so that it does not overlap with the interconnection line on a plane of the substrate and including a program interconnection section which forms a program forming a signal path so that a defective memory cell can be substituted by the redundancy memory cell;
a first data transfer section extending over from the program interconnection block to the first memory block, and transferring program information relevant to the program of the program interconnection section to the first memory block; and
second to n-th data transfer sections respectively extending over from i-th (i: natural number) memory block to i+1-th memory block, and respectively transferring program information of the i-th memory block to the i+1-th memory block.

11. The device according to claim 10, wherein the first to n-th memory blocks, the functional circuit block and the program interconnection block are macros of a system LSI.

12. The device according to claim 10, wherein the program interconnection section has an element selected from a group consisting of a fuse and a non-volatile memory.

13. The device according to claim 10, wherein the first to n-th data transfer sections have a plurality of shift registers connected in series.

14. The device according to claim 13, further comprising:
a data path connected with the final-stage of the plurality of shift registers of the n-th data transfer section, and outputting the program information to the outside of the n-th memory block.

15. The device according to claim 10, further comprising:
first to n-th data holding sections respectively connected with the first to n-th data transfer sections, and respectively holding the program information of the first to n-th data transfer sections.

16. The device according to claim 10, wherein the first data transfer section further comprises a selection control section, which is connected in series between the plurality of shift registers, and selectively outputs the program information supplied from the program interconnection block and external program information supplied from the outside.

17. A semiconductor device comprising:
a memory block provided on a first semiconductor substrate, and including a plurality of memory cells recording information and a redundancy memory cell, the redundancy memory cell being substituted for at least one memory cell of the plurality memory cells and recording information in place of the memory cell, the memory block having a function of writing information to and reading information from the memory cell, no fuse being provided in the memory cell;
a program interconnection block provided on a second semiconductor substrate, and including a program interconnection section which forms a program forming a signal path so that a defective memory cell can be substituted by the redundancy memory cell; and
a data transfer section extending over from the program interconnection block to the memory block, and transferring program information relevant to the program of the program interconnection section to the memory block.

18. The device according to claim 17, wherein the memory block, the functional circuit block and the program interconnection circuit block are macros of a system LSI.

19. The device according to claim 17, wherein the program interconnection section has an element selected from a group consisting of a fuse and a non-volatile memory.

20. The device according to claim 17, wherein the data transfer section has a plurality of shift registers connected in series.

21. The device according to claim 20, further comprising:
a data path connected with the final-stage of the plurality of shift registers, and outputting the program information to the outside of the memory block.

22. The device according to claim 17, further comprising:
a data holding section connected with the data transfer section, and holding the program information of the data transfer section.

23. The device according to claim 17, wherein the data transfer section further comprises a section control section, which is connected in series between the plurality of shift register, and selectively outputs the program information supplied from the program interconnection block and external program information supplied from the outside.

* * * * *